United States Patent
Kushnarenko et al.

(10) Patent No.: US 8,339,102 B2
(45) Date of Patent: Dec. 25, 2012

(54) SYSTEM AND METHOD FOR REGULATING LOADING ON AN INTEGRATED CIRCUIT POWER SUPPLY

(75) Inventors: Alexander Kushnarenko, Haifa (IL); Ifat Nitzan, Petach Tikva (IL)

(73) Assignee: Spansion Israel Ltd, Netanya (IL)

( * ) Notice: Subject to any disclaimer, the term of this patent is extended or adjusted under 35 U.S.C. 154(b) by 514 days.

(21) Appl. No.: 10/986,799

(22) Filed: Nov. 15, 2004

(65) Prior Publication Data

US 2005/0174709 A1 Aug. 11, 2005

Related U.S. Application Data

(60) Provisional application No. 60/542,871, filed on Feb. 10, 2004.

(51) Int. Cl.
*H02J 7/00* (2006.01)
(52) U.S. Cl. .................................................. 320/132
(58) Field of Classification Search .......... 323/234, 323/267; 333/17.1, 17.3; 307/38; 320/132
See application file for complete search history.

(56) References Cited

U.S. PATENT DOCUMENTS

| | | | |
|---|---|---|---|
| 4,961,010 A | 10/1990 | Davis | |
| 5,029,063 A | 7/1991 | Lingstaedt et al. | |
| 5,081,371 A | 1/1992 | Wong | |
| 5,142,495 A | 8/1992 | Canepa | |
| 5,142,496 A | 8/1992 | Van Buskirk | |
| 5,276,646 A | 1/1994 | Kim et al. | |
| 5,280,420 A | 1/1994 | Rapp | |
| 5,381,374 A | 1/1995 | Shiraishi et al. | |
| 5,422,847 A * | 6/1995 | Suizu | 365/189.14 |
| 5,534,804 A | 7/1996 | Woo | |
| 5,553,030 A | 9/1996 | Tedrow et al. | |
| 5,559,687 A | 9/1996 | Nicollini et al. | |
| 5,581,252 A | 12/1996 | Thomas | |
| 5,612,642 A | 3/1997 | McClintock | |
| 5,636,288 A | 6/1997 | Bonneville et al. | |
| 5,663,907 A | 9/1997 | Frayer et al. | |
| 5,672,959 A | 9/1997 | Der | |
| 5,675,280 A | 10/1997 | Nomura et al. | |
| 5,708,608 A | 1/1998 | Park et al. | |

(Continued)

FOREIGN PATENT DOCUMENTS

EP 0693781 1/1996

(Continued)

OTHER PUBLICATIONS

Martin, "Improved Circuits for the Realization of Switched-Capacitor Fillers", IEEE Transactions on Circuits and Systems, Apr. 1980, pp. 237-244, vol. CAS-27.

(Continued)

*Primary Examiner* — Arun Williams
(74) *Attorney, Agent, or Firm* — Fitan Mehulal & Sadot

(57) ABSTRACT

A load adjustment circuit and a method for adjusting a load are provided. The circuit may include a power source to supply power to a load, and a control unit to control a property of the load. The control unit may be adapted to adjust a property of the load based on a signal received from the power source. The method may include supplying power to a load and adjusting a property of the load to decrease the power supplied to the load if the power supplied to the load is greater than a maximum threshold.

15 Claims, 3 Drawing Sheets

U.S. PATENT DOCUMENTS

| | | | |
|---|---|---|---|
| 5,717,581 A | 2/1998 | Canclini | |
| 5,726,946 A | 3/1998 | Yamagata et al. | |
| 5,760,634 A | 6/1998 | Fu | |
| 5,808,506 A | 9/1998 | Tran | |
| 5,815,435 A | 9/1998 | Van Tran | |
| 5,847,441 A | 12/1998 | Cutter et al. | |
| 5,880,620 A | 3/1999 | Gitlin et al. | |
| 5,889,721 A * | 3/1999 | Gannage | 365/226 |
| 5,903,031 A | 5/1999 | Yamada et al. | |
| 5,910,924 A | 6/1999 | Tanaka et al. | |
| 5,946,258 A | 8/1999 | Evertt et al. | |
| 5,963,412 A | 10/1999 | En | |
| 6,005,423 A | 12/1999 | Schultz | |
| 6,028,324 A | 2/2000 | Su et al. | |
| 6,040,610 A | 3/2000 | Noguchi et al. | |
| 6,064,251 A | 5/2000 | Park | |
| 6,075,402 A | 6/2000 | Ghilardelli et al. | |
| 6,081,456 A | 6/2000 | Dadashev | |
| 6,094,095 A | 7/2000 | Murray et al. | |
| 6,107,862 A | 8/2000 | Mukainakano et al. | |
| 6,118,207 A | 9/2000 | Ormerod et al. | |
| 6,130,572 A | 10/2000 | Ghilardelli et al. | |
| 6,130,574 A | 10/2000 | Bloch et al. | |
| 6,150,800 A | 11/2000 | Kinoshita et al. | |
| 6,154,081 A | 11/2000 | Pakkala et al. | |
| 6,157,242 A | 12/2000 | Fukui | |
| 6,188,211 B1 | 2/2001 | Rincon-Mora et al. | |
| 6,198,342 B1 | 3/2001 | Kawai | |
| 6,208,200 B1 | 3/2001 | Arakawa | |
| 6,246,555 B1 | 6/2001 | Tham | |
| 6,285,614 B1 | 9/2001 | Mulatti et al. | |
| 6,297,974 B1 | 10/2001 | Ganesan et al. | |
| 6,339,556 B1 | 1/2002 | Watanabe | |
| 6,353,356 B1 | 3/2002 | Liu | |
| 6,356,469 B1 | 3/2002 | Roohparvar et al. | |
| 6,359,501 B2 | 3/2002 | Lin et al. | |
| 6,400,209 B1 | 6/2002 | Matsuyama et al. | |
| 6,433,624 B1 | 8/2002 | Grossnickle et al. | |
| 6,452,438 B1 | 9/2002 | Li | |
| 6,577,514 B2 | 6/2003 | Shor et al. | |
| 6,608,526 B1 | 8/2003 | Sauer | |
| 6,614,295 B2 | 9/2003 | Tsuchi | |
| 6,627,555 B2 | 9/2003 | Eitan et al. | |
| 6,654,296 B2 | 11/2003 | Jang et al. | |
| 6,665,769 B2 | 12/2003 | Cohen et al. | |
| 6,677,805 B2 | 1/2004 | Shor et al. | |
| 7,085,152 B2 * | 8/2006 | Ellis et al. | 365/149 |
| 2002/0024332 A1 * | 2/2002 | Gardner | 324/103 R |
| 2002/0145465 A1 | 10/2002 | Shor et al. | |
| 2002/0145483 A1 * | 10/2002 | Bouisse | 333/17.3 |
| 2002/0167827 A1 * | 11/2002 | Umeda et al. | 363/59 |
| 2003/0076159 A1 | 4/2003 | Shor et al. | |
| 2003/0107428 A1 * | 6/2003 | Khouri et al. | 327/536 |
| 2003/0202411 A1 | 10/2003 | Yamada | |
| 2004/0012990 A1 * | 1/2004 | O | 365/51 |
| 2004/0070906 A1 * | 4/2004 | Kohout et al. | 361/92 |
| 2004/0151034 A1 | 8/2004 | Shor et al. | |

FOREIGN PATENT DOCUMENTS

| | | |
|---|---|---|
| EP | 0 843 398 | 5/1998 |
| JP | 02001118392 | 4/2001 |

OTHER PUBLICATIONS

Klinke, et al , "A Very-High-Slew-Rate CMOS Operational Amplifier", IEEE Journal of Solid-State Circuits, 1989, pp. 744-746, vol. 24.

Shor, et al , "paper WA2 04 01—Self regulated Four-Phased Charge Pump with Boosted Wells", ISCAS 2002, 2002.

Fotouhi. "An Efficient CMOS Line Driver for 1.544-Mb/s T1 and 2 048-Mb/s E1 Applications", IEEE Journal of Solid-State Circuits, 2003, pp. 226-236, vol. 38.

* cited by examiner

«SYSTEM AND METHOD FOR REGULATING LOADING ON AN INTEGRATED CIRCUIT POWER SUPPLY

CROSS-REFERENCE TO RELATED APPLICATIONS

The present application claims priority from U.S. provisional patent application Ser. No. 60/542,871, filed Feb. 10, 2004, which is hereby incorporated by reference in its entirety.

FIELD OF THE INVENTION

The present invention relates to Voltage/Current sources in general, and more particularly, to a method and apparatus for driving a load or for adjusting a load driven by a voltage or current source.

BACKGROUND OF THE INVENTION

Non-volatile memory ("NVM") arrays, such as erasable, programmable read only memory (EPROM) or flash memory arrays, or electrically erasable, programmable read only memory (EEPROM) arrays, require high positive or negative voltages to program and erase memory cells of the array. Typically, these voltages are higher than the voltage supplied for other operations (Vdd). Voltage/Current sources are generally used to boost on-chip voltages above the supply voltage Vdd to reach the voltages required for programming or erasing. A charge pump may be used as a voltage/current source.

A charge pump may comprise cascaded stages that progressively boost the output voltage to higher levels. The charge pump may progressively store an increasing charge on a capacitor that is part of a capacitor-diode combination, with several such stages being placed together in a network to obtain the desired increase in voltage.

Reference is made to FIG. 1 which illustrates four stages of a commonly used four-stage charge pump architecture, called a four-phased-clock, threshold-voltage-canceling pump architecture (see Umezawa, IEEE Journal of Solid State Circuits, Vol. 27, 1992, page 1540).

The charge pump circuit includes a plurality of charge transfer transistors (reference letters $m_i$) connected in series. In FIG. 1, four such charge transfer transistors are shown, labeled $m_1$, $m_2$, $m_3$ and $m_4$. Charge transfer transistors $m_1$ may use, but are not limited to, CMOS (complementary metal oxide semiconductor) technology, being either n-channel or p-channel (NMOS or PMOS) field effect transistors (FETs). FIG. 1 illustrates a positive charge pump based on NMOS.

For the optimal design of voltage/current sources, such as charge pumps, it may be advantageous to know the characteristics of the load being driven by the power source. However, in some cases, it may be difficult to predict the output current that may be required by the load. For example, in memory devices, such as EPROM, Flash or EEPROM memory devices, many memory cells may require a high voltage at the same time, for example, to perform program and erase operations. In such operations, the current drawn by the the NVM cell may vary significantly based on factors such as voltage, temperature, process corners, number of program/erase cycles already passed, etc. If the total current of many NVM cells exceeds the capacity of the voltage/current source, then the voltage/current source may not be able to supply the required voltage to perform the operation of the memory device.

In addition to the difficulties in predicting the current required by a particular load, it may also be difficult to predict the output of the voltage/current source, because it may be dependent upon many unstable variables such as the positive voltage supply (Vdd), temperature, process conditions and load. As such, an appropriate regulation apparatus may be used to control and provide a desired voltage at the output of the voltage/current source.

Accordingly, in many cases, a regulation method may be used to enhance the operation of the charge pump. This may be accomplished by using a regulator to regulate the pump output. There are many approaches to regulating the output voltage, e.g., by Vdd voltage, Vdd current, by clock frequency, etc. The regulator may typically adjust the capability of the charge pump according to the required current of the load. Thus, for example, if the current of the load exceeds a maximum value, the regulator may not be able to adjust the charge pump and it may stay in saturation.

Known methods of regulating the output voltage of a charge pump suffer from limitations that may significantly affect the overall efficiency of its operation.

For example, one known method for providing regulation of the output of a charge pump suffers from the drawback of current inefficiency. As shown in the illustration of FIG. 2, the regulated output voltage of charge pump 100 which is driven to load 120 is fed into a voltage divider 102 and compared to a reference voltage (Vref) 104 at operational amplifier 106. In this circuit, the regulation of the output of charge pump 100 is achieved by shunting the output to ground 108. Thus, when charge pump 100 operates at minimum energy, e.g., low Vdd, the current dissipated through ground 108 is, likewise, low. However, when charge pump 100 operates at higher energy conditions, e.g., high Vdd, current is dissipated through ground 108, resulting in inefficient operation of the regulating system of FIG. 2.

SUMMARY OF THE INVENTION

According to an embodiment of the present invention, there is provided a load adjustment circuit comprising a power source to supply power to a load and a control unit to control a property of said load, wherein said control unit adjusts said property of the load based on a signal received from said power source.

According to an embodiment of the present invention, there is provided a method of adjusting a load comprising supplying power to a load and determining whether the power supplied to said load is greater than a maximum threshold and if so, adjusting a property of said load to decrease the power supplied to said load.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

Figure 1:
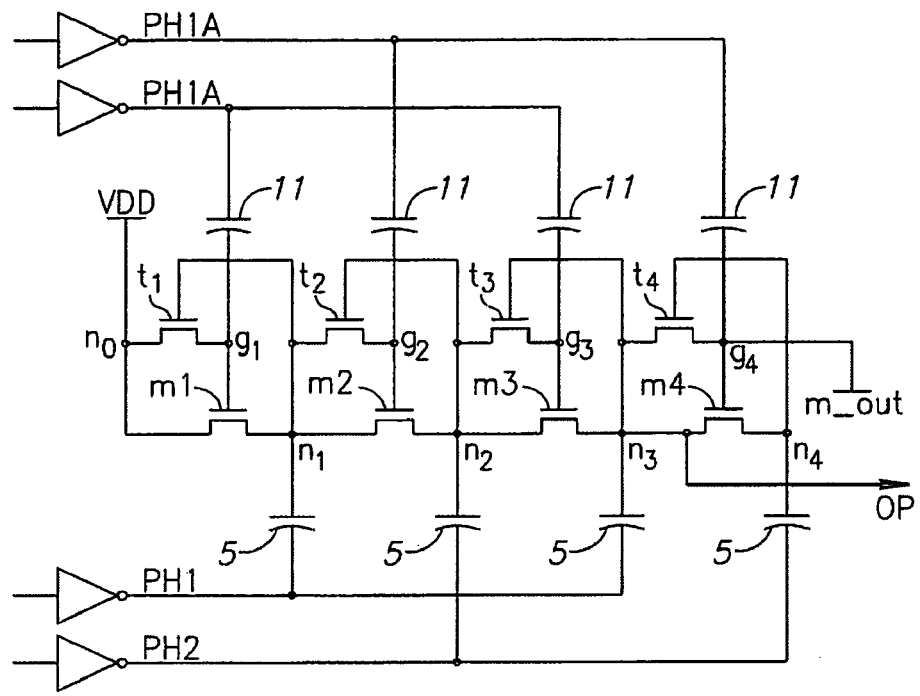
FIG. 1 is a simplified circuit diagram of a commonly used charge pump architecture including a four-phased charge pump.
Figure 2:
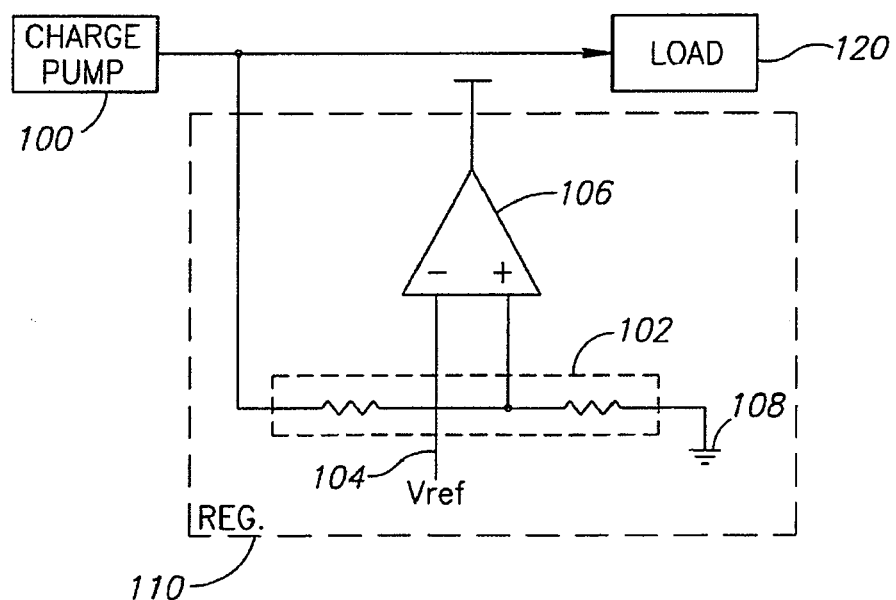
FIG. 2 is a block diagram illustration of a commonly used shunting system for charge pump output voltage regulation.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

Figure 3:
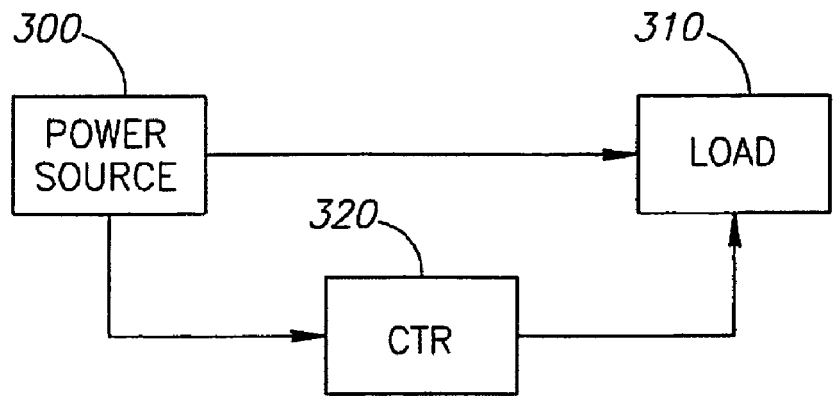
FIG. 3 is a simplified block diagram illustration of an apparatus for adjusting a load in accordance with some embodiments of the present invention.

Reference is made to FIG. 3 which is a simplified block diagram illustration of an apparatus for adjusting a load supplied by a voltage/current source in accordance with some embodiments of the present invention.

Some embodiments of the present invention may include a power source 300, which power may, for example, be used to boost on-chip voltages above the supply voltage Vdd. In some embodiments, the output of power source 300 may be used to reach voltages required for programming or erasing memory cells. The power source may drive a load 310. Control unit 320 may adjust a property of load 310. In some embodiments of the present invention, power source 300 may be a constant voltage/current source. Control unit 320 may receive signals relating to the power supplied to load 310 and accordingly adjust a property of load 310 to increase or decrease its power consumption.

Various parameters alone or in combination with each other may be used to correspond to a property of the load 310 adjusted by control unit 320. In some embodiments of the present invention, the property of the load may be its size. For example, in some embodiments of the invention, load 310 may be a segmented virtual ground array having connectable cells or groups of cells. Thus, for example, adjusting the size of the load may entail connecting or disconnecting a word line or a bit line within load 310. Other properties of the load being driven that may be adjusted by control unit 320 are the output impedance, e.g., the number of connected bit lines, or the number of connected memory cells.

Figure 4:
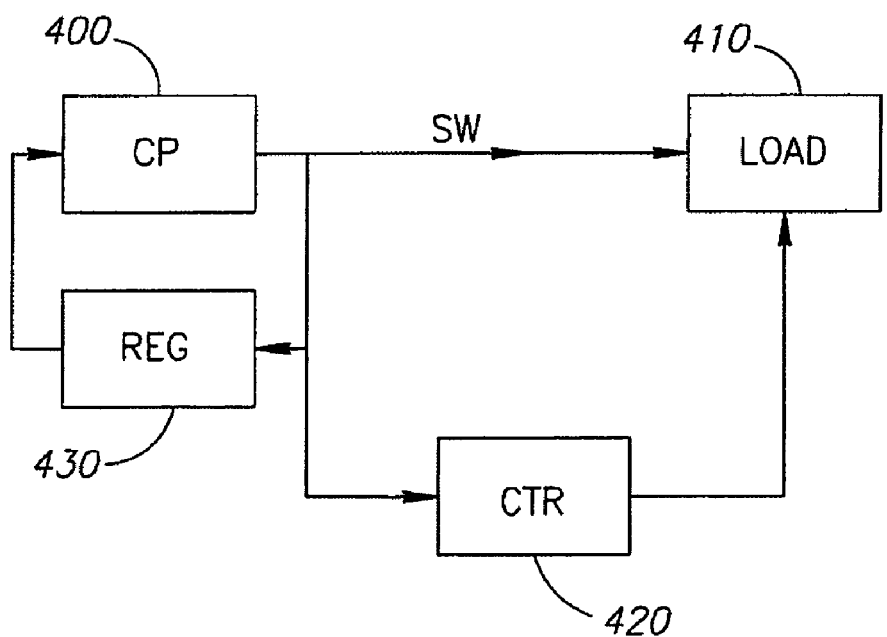
FIG. 4 is a simplified block diagram illustration of a regulated apparatus for adjusting a load in accordance with some embodiments of the present invention.

Reference is now made to FIG. 4 which is a simplified block diagram illustration of a regulated apparatus for adjusting a load in accordance with some embodiments of the present invention.

In accordance with some embodiments of the invention, if an output parameter of the power source 400, for example, the output current or voltage reaches or exceeds a maximum threshold value, control unit 420 may generate an overload signal, triggering an adjustment mechanism to adjust a property of load 410, for example, in order to decrease the power required by the load 410. The maximum threshold, may, for example, correspond to the maximum voltage that the power source 400 is capable of supplying, thereby avoiding frequent exhaustion of the power source. Control unit 420 may incrementally adjust one or more properties of load 410 based on such overload signal, until the overload signal is no longer generated.

In the embodiment shown, regulator 430 may operate in conjunction with control unit 420. Regulator 430 may regulate the operation of the power source 400. Thus, in some instances of overload, the power source may be adjusted, and in other instances of overload, the load may be adjusted, and in yet other instances, both may be adjusted. The choice may depend on a variety of factors, for example, mode of operation or other operating conditions. Thus, an overload signal may be generated, for example, from regulator 430 to control unit 420.

The adjustment of load, in accordance with some embodiments of the invention may be performed by using an array architecture described in U.S. Pat. No. 5,963,465 titled "A SYMMETRIC SEGMENTED MEMORY ARRAY ARCHITECTURE". A load unit may comprise a portion of an area in the array, and therefore, adjusting the load may be performed without adding additional circuitry.

Figure 5:
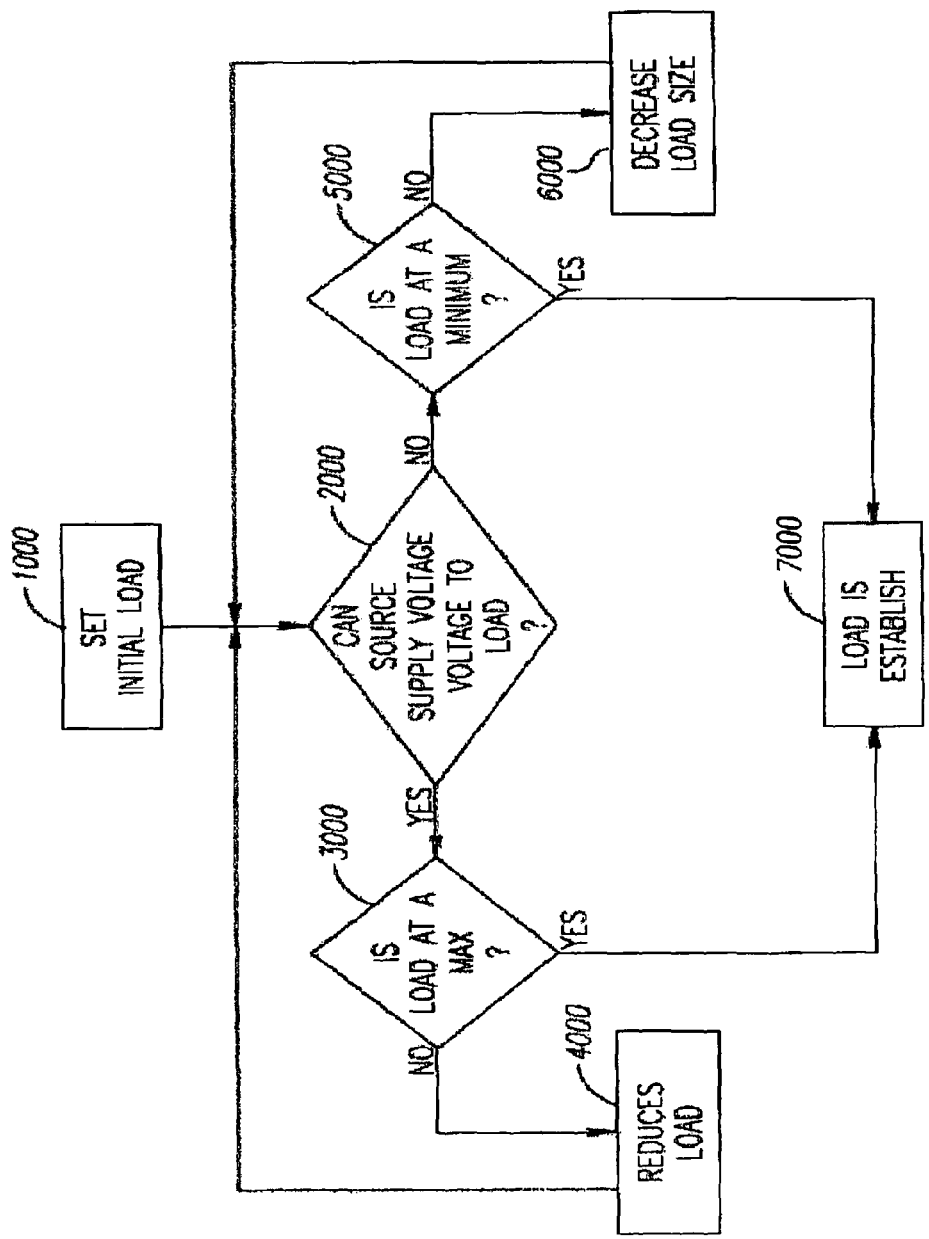
FIG. 5 is a flow chart illustration of a method to adjust a load, in accordance with some embodiments of the present invention.

Reference is now made to FIG. 5 which is a flow chart illustration of a method to adjust a load, in accordance with some embodiments of the present invention.

In accordance with some embodiments of the invention, the control unit may set an initial load. The control unit may initially connect the voltage/current source to a minimum number of load units, for example, one load unit, or to a maximum number of load units, for example, the memory array (block 1000). A load unit may, for example, be a block or sub-array of memory cells, one or a number of word lines or bit lines, or an individual memory cell. As long as a voltage/current source is capable of supplying power to this size of load within certain limits, the "overload" signal may not be set, for example, by an overload bit being at a "0" logic level, and the number of load units driven by the power source may be increased (blocks 2000 and 4000). These blocks may be repeated as long as the load is not at its maximal size or as long as the power source is able to supply the sufficient power to the load (block 3000). When the voltage/current is incapable of supplying power to the load within certain limits (block 2000), the "overload" signal may be set, for example, by adjusted an overload bit to a "1" logic level. In such case, as long as the charge pump is connected to more than one load unit, the amount of load units may be decreased (blocks 5000 and 6000). Accordingly, the size of the load may be established (block 7000).

The method of the present invention may define an optimal load parameter. The optimal load parameter may be the lesser of the total size of the load, for example, all memory cells in an array being driven, or the maximum load that the power source is able to drive simultaneously. The optimal load parameter may, for example, be used as a default parameter in the operation of the present invention. In accordance with embodiments of the present invention, the optimal power may be determined every number of cycles of operation of the load or it may be reset when the "overload" signal is set from active to inactive, for example, when an overload bit is changed from "1" to "0".

In accordance with some embodiments of the present invention, the load may be further adjusted due to fabrication parameters such as process corners (e.g. cells with extreme characteristics), temperature changes, Vdd and load current fluctuation.

The voltage/current source of embodiments of the present invention may be any suitable power source, for example, a constant voltage/current source or one or more charge pumps to boost on-chip voltages above the supply voltage Vdd to reach the voltages required for programming or erasing. However, it will be understood by those of ordinary skill in the art that the present invention may be practiced with other Voltage/Current sources in addition to or in place of such one or more charge pumps.

Some embodiments of the present invention benefit from a significant reduction in the on-chip area required for a power source, such as a charge pump, for example, by requiring a reduced number of capacitors to boost voltages above the supply voltage Vdd to reach the voltages required for programming or erasing. Typically, in conventional design of charge pumps, the fluctuation of a load may be covered by added capacitors to boost the voltage above the supply voltage Vdd. In accordance with some embodiments of the invention, the fluctuation of the load may be covered by adapting the load to the voltage/current source.

It will be appreciated by person skilled in the art, that the present invention is not limited by what has been particularly shown and described in the embodiments described hereinabove.

The invention claimed is:

1. A non-volatile memory device comprising:
 a charge pump to supply power to a load comprised of a set of selectively connectable load units, wherein each load unit includes a set of non-volatile memory cells; and
 a load adjusting circuit to adjust a number of load units concurrently connected to said charge pump based on an overload signal from said charge pumps
 wherein said charge pump, said load adjusting circuit, and said load are disposed on a memory chip.

2. The load adjustment circuit of claim 1, wherein said charge pump is a phased charge pump.

3. The load adjustment circuit according to claim 1, comprising a regulator to regulate said charge pump.

4. The load adjustment circuit according to claim 1, wherein said charge pump is a constant power source.

5. The load adjustment circuit according to claim 1, wherein said number of load units comprise a segmented virtual ground array.

6. A method of operating a non-volatile memory device including a load comprised of a number of selectively detachable non-volatile memory cell load segments of the non-volatile memory device, said method comprising:
 supplying power from a charge pump to said load; and
 determining based on an overload signal from said charge pump whether the power supplied to said load is greater than a maximum threshold of the charge pump and if so, changing a number of load segments concurrently connected to said charge pump.

7. The method of claim 6, comprising determining whether the power supplied to said load is less than a minimum threshold and if so, increasing the number of load segments concurrently connected to said charge pump.

8. The method of claim 6, wherein said maximum threshold is pre-determined.

9. The method of claim 6, wherein said maximum threshold is determined based on operating conditions of said load.

10. The method of claim 6, wherein said maximum threshold is determined based on fabrication parameters of said load.

11. The method of claim 6, comprising determining whether the power supplied to said load is greater than said maximum threshold and if so, reducing the number of load segments concurrently connected to said charge pump.

12. The method of claim 11, comprising determining whether the power supplied to said load is less than a minimum supply threshold and if so, increasing the number of load segments concurrently connected to said charge pump.

13. A method of operating a non-volatile memory device comprising:
 adjusting a load of the non-volatile device on a charge pump of the non-volatile device by supplying power from said charge pump to said load of segments of non-volatile memory cells; and
 determining based on an overload signal received from said charge pump whether the power supplied to said load is less than a minimum threshold and if so, changing the number of load segments concurrently connected to said charge pump.

14. A non-volatile memory device according to claim 1 wherein said memory chip is a single memory chip.

15. A non-volatile memory device according to claim 1 wherein said digital overload signal includes a single bit which changes for indicating an overload condition.

* * * * *